US012795992B2

(12) United States Patent
Yang et al.

(10) Patent No.: US 12,795,992 B2
(45) Date of Patent: Nov. 10, 2026

(54) ARRAY SUBSTRATE AND MANUFACTURING METHOD THEREOF, AND DISPLAY DEVICE

(71) Applicant: TCL CHINA STAR OPTOELECTRONICS TECHNOLOGY CO., LTD., Shenzhen (CN)

(72) Inventors: Hui Yang, Shenzhen (CN); Yani Chen, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 692 days.

(21) Appl. No.: 17/870,541

(22) Filed: Jul. 21, 2022

(65) Prior Publication Data

US 2024/0006537 A1 Jan. 4, 2024

(30) Foreign Application Priority Data

Jul. 4, 2022 (CN) ........................ 202210786270.4

(51) Int. Cl.
*H10D 30/67* (2025.01)
*H10D 30/01* (2025.01)
*H10D 64/01* (2025.01)

(52) U.S. Cl.
CPC ..... *H10D 30/6723* (2025.01); *H10D 30/0316* (2025.01); *H10D 30/0321* (2025.01); *H10D 64/01* (2025.01)

(58) Field of Classification Search
CPC ........... H10D 30/6723; H10D 30/0316; H10D 30/6732; H10D 30/0321; H10D 64/01;
(Continued)

(56) References Cited

U.S. PATENT DOCUMENTS

2012/0168756 A1 7/2012 Ryu et al.
2016/0307986 A1* 10/2016 Gai ........................ H10D 86/40
(Continued)

FOREIGN PATENT DOCUMENTS

CN 203288600 U 11/2013
CN 106876386 A 6/2017
(Continued)

OTHER PUBLICATIONS

Chinese Office Action issued in corresponding Chinese Patent Application No. 202210786270.4 dated Jan. 8, 2025, pp. 1-6, 13pp.

*Primary Examiner* — Leonard Chang
*Assistant Examiner* — Nathan Pridemore
(74) *Attorney, Agent, or Firm* — The Roy Gross Law Firm, LLC; Roy D. Gross

(57) ABSTRACT

The present application provides an array substrate including at least a gate layer, a gate insulation layer, an active layer, and a light blocking layer, wherein the gate insulation layer and the active layer are disposed sequentially on the gate layer, the gate insulation layer has a central region overlapped with the active layer and a peripheral region surrounding the central region, the active layer has a first surface away from the gate insulation layer, and the gate insulation layer has a third surface located in the central region and in contact with the active layer, and the light blocking layer is disposed in the peripheral region and having a second surface away from the gate insulation layer, wherein a height of the second surface relative to the third surface is greater than a height of the first surface relative to the third surface.

11 Claims, 4 Drawing Sheets

(58) Field of Classification Search
CPC ........... H10D 30/6738; H10D 30/6717; H10D 30/031; H10D 30/67; H10K 59/126
See application file for complete search history.

(56) References Cited

U.S. PATENT DOCUMENTS

| | | | | |
|---|---|---|---|---|
| 2017/0288001 | A1* | 10/2017 | Ito | H10K 59/60 |
| 2021/0057531 | A1* | 2/2021 | Chen | H10D 30/0316 |

FOREIGN PATENT DOCUMENTS

| | | | | | |
|---|---|---|---|---|---|
| CN | 112018148 | A | * | 12/2020 | G06V 40/12 |
| KR | 19980026562 | A | | 7/1998 | |

* cited by examiner

ARRAY SUBSTRATE AND MANUFACTURING METHOD THEREOF, AND DISPLAY DEVICE

CROSS REFERENCE TO RELATED APPLICATIONS

This application claims the benefit of priority of Chinese Patent Application No. 202210786270.4, filed Jul. 4, 2022, the contents of which is incorporated herein by reference in their entirety.

TECHNICAL FIELD

The present application relates to a field of display technology, and more particularly to an array substrate, a method of manufacturing the array substrate, and a display device.

BACKGROUND

With the development of electronic technology, a display device including an array substrate is widely used in more and more applications.

Therefore, how to ensure the reliability of signal transmission in the array substrate is a problem to be solved at present.

SUMMARY

To solve the above problem or other problems, the present application provides the following technical solutions.

In a first aspect, the present application provides an array substrate comprising at least:

a gate insulation layer and an active layer disposed sequentially on a gate layer, wherein the gate insulation layer has a central region overlapped with the active layer and a peripheral region surrounding the central region, the active layer has a first surface away from the gate insulation layer, and the gate insulation layer has a third surface located in the central region and in contact with the active layer; and a light blocking layer disposed in the peripheral region and having a second surface away from the gate insulation layer, wherein a height of the second surface relative to the third surface is greater than a height of the first surface relative to the third surface.

According to the array substrate of an embodiment of the present application, the gate insulation layer has a fourth surface located in the peripheral region and in contact with the light blocking layer, the third surface and the fourth surface extend in the same plane, the active layer has a first thickness, and the light blocking layer has a second thickness, wherein the second thickness is greater than the first thickness.

According to the array substrate of an embodiment of the present application, the array substrate further comprises a source/drain layer disposed on the active layer and having a third thickness, wherein the third thickness is equal to the second thickness.

According to the array substrate of an embodiment of the present application, a material of the light blocking layer is the same as a material of the source/drain layer, and the light blocking layer and the source/drain layer are separated by a dielectric material.

According to the array substrate of an embodiment of the present application, the potential of the light blocking layer is configured to be floating.

According to the array substrate of an embodiment of the present application, the material of the light blocking layer is the same as a material of the gate insulation layer.

According to the array substrate of an embodiment of the present application, the light blocking layer is in contact with the active layer.

In a second aspect, the present application provides a method of manufacturing an array substrate, the method comprising at least:

sequentially forming a gate insulation layer and an active layer on a gate layer, wherein the gate insulation layer has a central region overlapped with the active layer and a peripheral region surrounding the central region, the active layer has a first surface away from the gate insulation layer, and the gate insulation layer has a third surface located in the central region and in contact with the active layer; and forming a light blocking layer in the peripheral region, wherein the light blocking layer has a second surface away from the gate insulation layer, a height of the second surface relative to the third surface is greater than a height of the first surface relative to the third surface.

According to the method of an embodiment of the present application, the step of forming a light-blocking layer in the peripheral region specifically comprises:

forming a light blocking layer located in the peripheral region and a source/drain layer located on the active layer with the same mask.

In a third aspect, the application provides a display device comprising at least the array substrate according to any one of the foregoing.

The present application has the beneficial effects: the present application provides an array substrate and a method of manufacturing the same, and a display panel, wherein the array substrate comprises at least a gate layer, a gate insulation layer, an active layer, and a light blocking layer, wherein the gate insulation layer and the active layer are disposed sequentially on the gate layer, the gate insulation layer has a central region overlapped with the active layer and a peripheral region surrounding the central region, the active layer has a first surface away from the gate insulation layer, and the gate insulation layer has a third surface located in the central region and in contact with the active layer, and the light blocking layer is disposed in the peripheral region and having a second surface away from the gate insulation layer, wherein a height of the second surface relative to the third surface is greater than a height of the first surface relative to the third surface. According to the present application, the light blocking layer is configured to be disposed in the peripheral region of the gate insulation layer to shield the light incident into the peripheral region, thereby preventing the light from being further incident into the active region due to diffuse reflection in the peripheral region. Therefore, the problem of light leakage caused by the generation of optical carriers in the active layer is avoided.

BRIEF DESCRIPTION OF THE DRAWINGS

In order to more clearly illustrate the technical solutions in embodiments of the present application, the accompanying drawings depicted in the description of the embodiments will be briefly described below. It will be apparent that the accompanying drawings in the following description are merely some embodiments of the present application, and other drawings may be obtained from these drawings without creative effort by those skilled in the art.

EMBODIMENTS OF THE PRESENT DISCLOSURE

Figure 1:
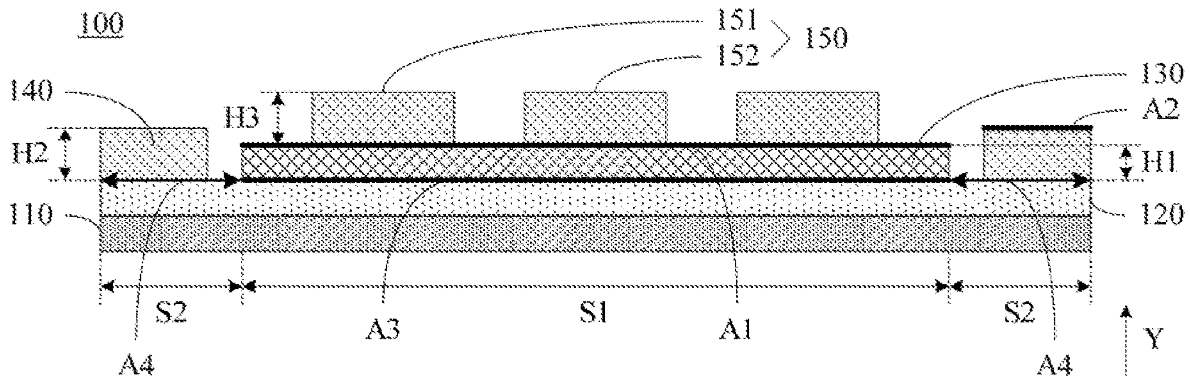
FIG. 1 is a schematic front view of the structure of an array substrate according to a first embodiment of the present application.

Technical solutions in embodiments of the present application will be clearly and completely described below in conjunction with drawings in the embodiments of the present disclosure. Obviously, the described embodiments are only a part of embodiments of the present disclosure, rather than all the embodiments. Any ordinarily skilled person in the technical field of the present invention could still obtain other accompanying drawings without use laborious invention based on the present accompanying drawings.

In the description of the present application, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present application, rather than indicate or imply that the devices or elements referred to herein are required to have specific orientations or be constructed or operate in the specific orientations. Accordingly, the terms should not be construed as limiting the present application. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present application, the meaning of "plurality" is two or more, unless otherwise specifically defined.

In the description of the present application, it should be noted that the terms "installation", "connection" and "coupling" should be understood in a broad sense, unless otherwise clearly specified and defined. For example, it can be a fixed connection, a detachable connection, or integrated connection; it can be a mechanical connection, an electrical connection or can communicate with each other; it can be directly connected or indirectly connected through an intermediary, it can also be the connection between two elements or the interaction between two elements. Those ordinary skilled in the art can understand the specific meanings of the above terms in the present application according to specific situations.

In the present application, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that horizontal height of the first feature is lower than that of the second feature.

The following description provides various embodiments or examples for implementing various structures of the present application. To simplify the description of the present application, parts and settings of specific examples are described as follows. Certainly, they are only illustrative, and are not intended to limit the present application. Further, reference numerals and reference letters may be repeated in different examples of the present application. This repetition is for purposes of simplicity and clarity and does not indicate a relationship of the various embodiments and/or the settings. Furthermore, the present application provides specific examples of various processes and materials, however, applications of other processes and/or other materials may be appreciated those skilled in the art.

Figure 2:
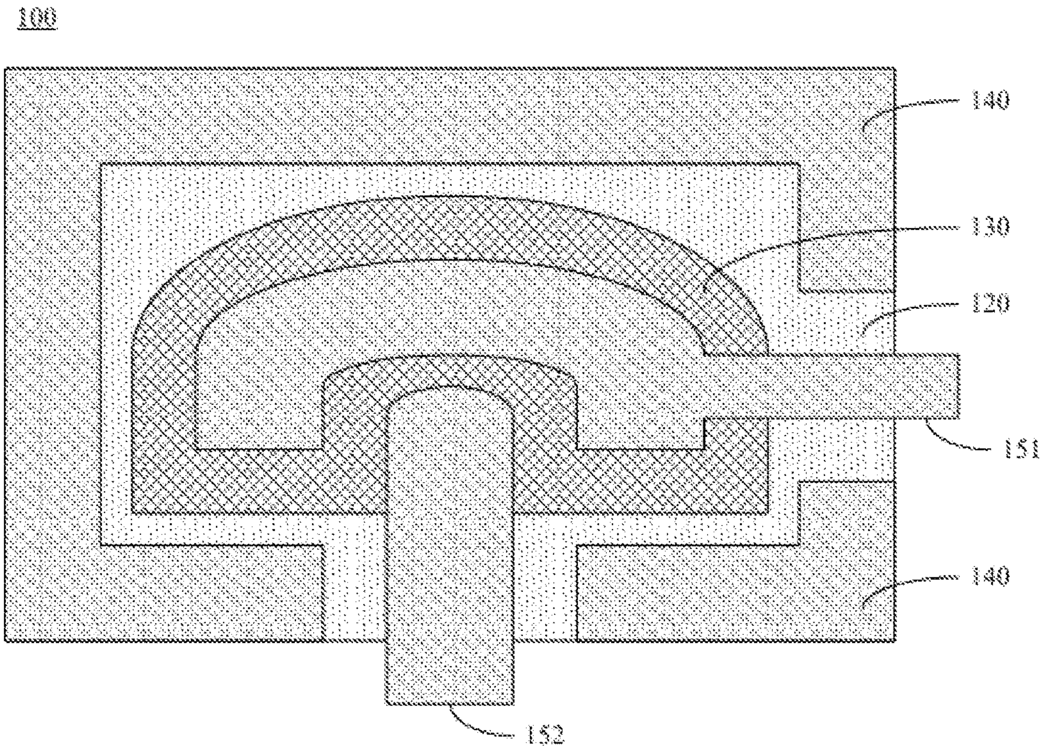
FIG. 2 is a schematic top view of the structure of an array substrate according to a first embodiment of the present application.
Figure 3:
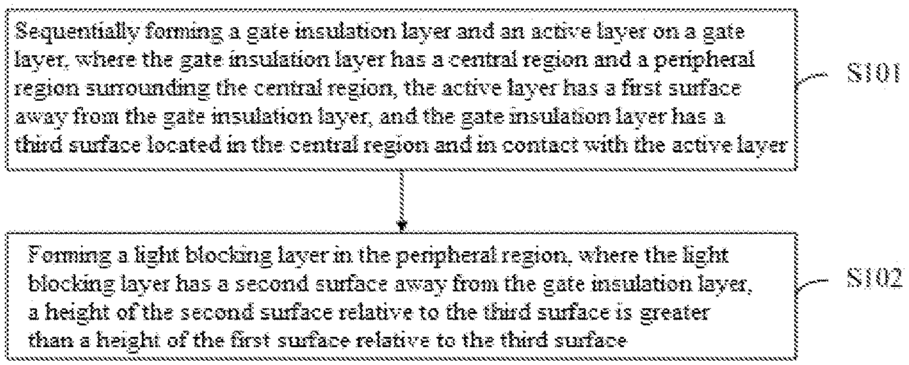
FIG. 3 is a schematic flowchart of a method of manufacturing an array substrate according to a first embodiment of the present application.

FIGS. 1 and 2 show a schematic front view and a schematic top view of the structure of an array substrate 100 according to a first embodiment of the present application, respectively. Various components of the array substrate 100 according to the first embodiment of the present application and position relationships among them can be clearly seen from the FIGS. 1 and 2.

As shown in FIGS. 1 and 2, the array substrate 100 includes at least a gate layer 110, a gate insulation layer 120, an active layer 130, and a light blocking layer 140. Components in the array substrate 100 will be described below in detail with reference to FIGS. 1 and 2.

The gate insulation layer 120 and the active layer 130 are sequentially disposed on the gate layer 110. Specifically, as shown in FIGS. 1 and 2, the active layer 130 does not completely overlap the gate insulation layer 120 in a plane parallel to the gate layer 110. Specifically, the gate insulation layer 120 has a central region S1 overlapped with the active layer 130 and a peripheral region S2 surrounding the central region S1.

Further, the active layer 130 has a first surface A1 away from the gate insulation layer 120, and the gate insulation layer 120 has a third surface A3 located in the central region S1 and in contact with the active layer 130.

Specifically, in an embodiment of the present application, the material of the gate layer 110 may be a metal such as silver (Ag), aluminum (Al), nickel (Ni), chromium (Cr), molybdenum (Mo), copper (Cu), tungsten (W), titanium (Ti), or any combination of the materials. Further, the material of the gate insulation layer 120 may be silicon oxide (SiNx), silicon nitride (SiOx), or a combination of the materials. Further, the material of the active layer 130 may be amorphous silicon (a-Si) or any other suitable materials.

A light blocking layer 140 is disposed in the peripheral region S2 and has a second surface A2 away from the gate insulation layer 120, where a height of the second surface A2 relative to the third surface A3 is greater than a height of the first surface A1 relative to the third surface A3 in the thickness direction Y of the gate insulation layer 120.

It should be noted that steps such as deposition and etching steps are performed in the process of manufacturing the array substrate 100, so that the array substrate 100 may have a rough surface (for example, the peripheral region S2). Therefore, the light incident into the peripheral region S2 from the backlight module at the bottom of the gate layer 110 is diffusely reflected due to the rough surface of the peripheral region S2, and then the light is further incident into the active layer 130, to generate optical carriers in the active layer 130, which causes problems such as light leakage, further deteriorated vertical crosstalk, and a threshold voltage offset.

Referring now to FIGS. 1 and 2, in the embodiment of the present application, The light blocking layer 140 is configured to be disposed in the peripheral region S2, and the second surface A2 of the light blocking layer 140 away from the gate insulation layer 120 is higher than the first surface A1 of the active layer 130 away from the gate insulation layer 120 in the thickness direction Y of the gate insulation layer 120. That is, the light blocking layer 140 can block light incident into the peripheral region S2, thereby preventing the light from being further incident into the active layer 130. As a result, the problem of light leakage in the active layer 130 due to the generation of optical carriers is avoided.

Specifically, the material of the light blocking layer 140 is an opaque material, and further, may be a metal, a metal oxide, an insulating material, or any other suitable material.

Referring to FIGS. 3 and 5*a*-5*c*, which show a schematic flowchart of a method of manufacturing an array substrate 100 according to the first embodiment of the present application and process flow diagrams of a method of manufacturing an array substrate according to the first embodiment of the present application, respectively.

As shown in FIGS. 3 and 5*a*-5*c*, the method of manufacturing the array substrate 100 may specifically include the following steps:

S101: sequentially forming a gate insulation layer 120 and an active layer 130 on a gate layer 110, where the gate insulation layer 120 has a central region S1 overlapped with the active layer 130 and a peripheral region S2 surrounding the central region S1, the active layer 130 has a first surface A1 away from the gate insulation layer 120, and the gate insulation layer 120 has a third surface A3 located in the central region S1 and in contact with the active layer 130; and S102: forming a light blocking layer 140 in the peripheral region S2, where the light blocking layer 140 has a second surface A2 away from the gate insulation layer 120, a height of the second surface A2 relative to the third surface A3 is greater than a height of the first surface A1 relative to the third surface A3.

Further, referring to FIG. 1, in an embodiment of the present application, the gate insulation layer 120 has a fourth surface A4 located in the peripheral region S2 and in contact with the light blocking layer 140, and the third surface A3 and the fourth surface A4 extend in the same plane, that is, the surface of the gate insulation layer 120 away from the gate layer 110 is in a form of a plane.

Further, with respect to FIG. 1, in an embodiment of the present application, the active layer 130 has a first thickness H1 and the light blocking layer 140 has a second thickness H2, where the second thickness H2 is greater than the first thickness H1. That is, in the thickness direction Y of the gate insulation layer 120, the thicker light blocking layer 140 can block the light incident into the peripheral region S2 to prevent the light from being further incident into the active layer 130, thereby ensuring that no optical carriers are generated in the active layer 130.

Further, referring to FIG. 1, the array substrate 100 further includes a source/drain layer 150 disposed on the active layer 130. Specifically, a material of the source/drain layer 150 may be a metal such as silver (Ag), aluminum (Al), nickel (Ni), chromium (Cr), molybdenum (Mo), copper (Cu), tungsten (W), titanium (Ti), or a combination of the materials, or may be a transparent metal oxide such as Indium Tin Oxide (ITO).

Specifically, as shown in FIGS. 1 and 2, the source/drain layer 150 includes a source 151 and a drain 152. Further, in the present embodiment, the shape of the source 151 is approximately U-shaped and the shape of the drain 152 is linear. However, in other embodiments of the present application, the source 151 and the drain 152 may be designed in any suitable pattern.

It should be noted that the number of masks used in the process of manufacturing the array substrate 100 needs to be controlled so as to reduce the cost of the process as much as possible. Therefore, in the present embodiment, the light blocking layer 140 and the source/drain layer 150 can be simultaneously formed in one step with the same mask.

Figure 4:
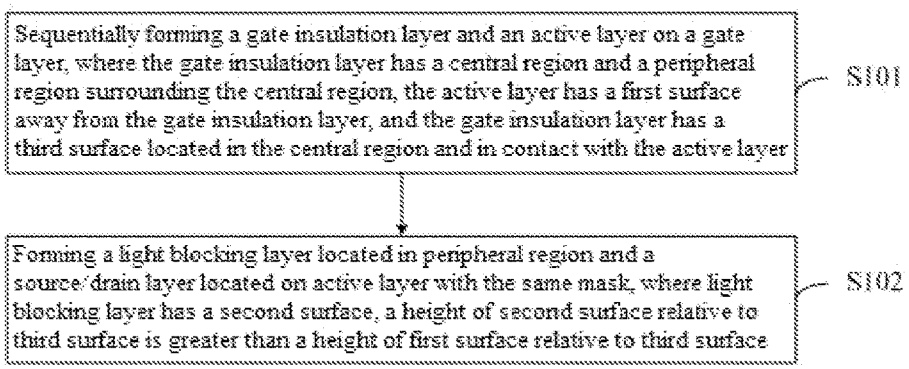
FIG. 4 is a further schematic flowchart of a method of manufacturing an array substrate according to a first embodiment of the present application.
Figure 5A:
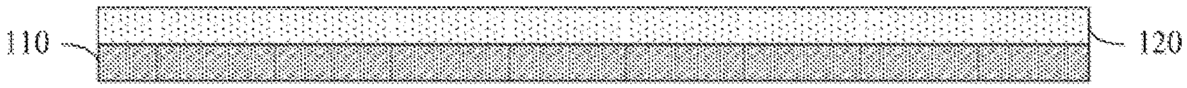
FIG. 5*a* is a process flow diagram of a method of manufacturing an array substrate according to a first embodiment of the present application.
Figure 5B:
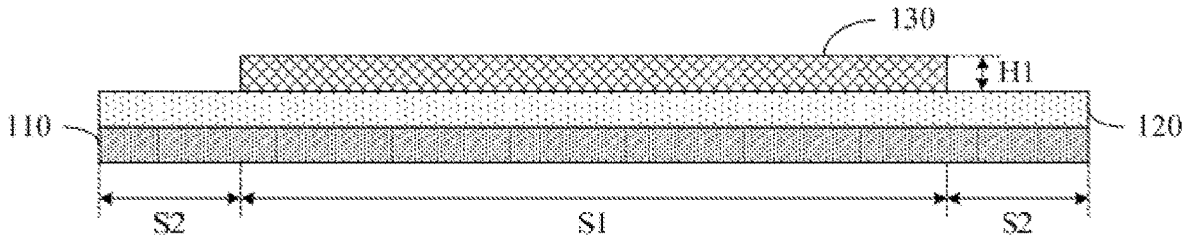
FIG. 5*b* is a process flow diagram of a method of manufacturing an array substrate according to a first embodiment of the present application.
Figure 5C:
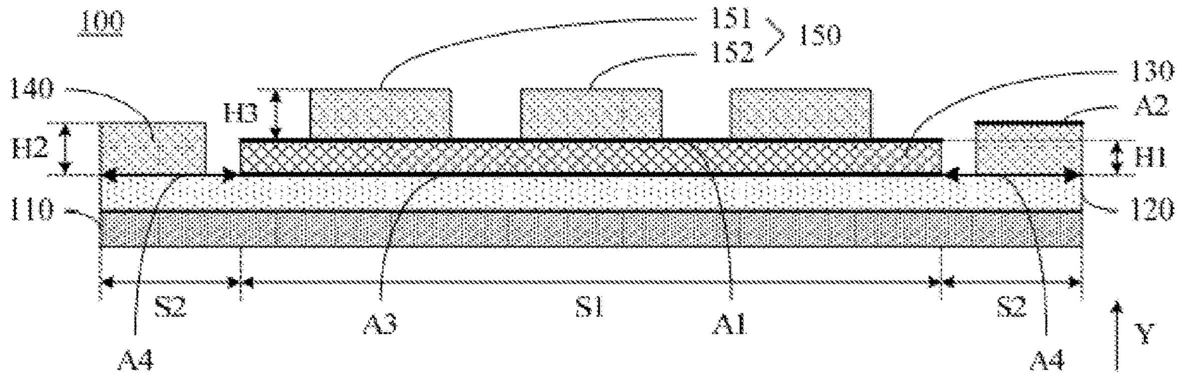
FIG. 5*c* is a process flow diagram of a method of manufacturing an array substrate according to a first embodiment of the present application.

For example, referring to FIG. 4, which shows a further schematic flowchart of a method of manufacturing an array substrate 100 according to the first embodiment of the present application. The foregoing second step S102 may specifically include:

forming a light blocking layer 140 located in the peripheral region S2 and a source/drain layer 150 located on the active layer 130 with the same mask, where the light blocking layer 140 has a second surface A2 away from the gate insulation layer 120, a height of the second surface A2 relative to the third surface A3 is greater than a height of the first surface A1 relative to the third surface A3.

It should be noted that, since the light blocking layer 140 and the source/drain layer 150 are formed in the same step, in some embodiments, the second thickness H2 of the light blocking layer 140 is equal to the third thickness H3 of the source/drain layer 150, and the material of the light blocking layer 140 is the same as the material of the source/drain layer 150.

It should be understood that, in other variations of the present application, although the light blocking layer 140 and the source/drain layer 150 are formed in the same step, the above-mentioned second thickness H2 may not be equal to the third thickness H3 due to factors such as a process error or a setting of a process parameter.

Further, since both the light blocking layer 140 and the source/drain layer 150 are made of both a metal or a metal oxide in the present embodiment, they are separated from a dielectric material, and the potential of the light blocking layer 140 is configured to be floating, so as to ensure that the added light blocking layer 140 has no effect on the transmission of an electric signal in the source/drain layer 150.

Further, referring to FIG. 2, the light blocking layer 140 has an annular structure. Specifically, the light blocking layer 140 is disposed around the active layer 130 and at the edge of the gate insulation layer 120. Further, the light-blocking layer 140 has a plurality of openings (not shown), the positions of which correspond to the positions at which the source 151 and the drain 152 extend out of the active layer 130, respectively. It should be noted that the plurality of openings are provided to ensure that the light-blocking layer 140 manufactured by a metal or a metal oxide does not contact the source 151 and the drain 152.

According to the foregoing, the first embodiment of the present application provides an array substrate 100 including at least a gate layer 110, a gate insulation layer 120, an active layer 130, and a light blocking layer 140, where the gate insulation layer 120 and the active layer 130 are disposed sequentially on the gate layer 110, the gate insulation layer 120 has a central region S1 overlapped with the active layer 130 and a peripheral region S2 surrounding the central region S1, the active layer 130 has a first surface A1 away from the gate insulation layer 120, and the gate insulation layer 120 has a third surface A3 located in the central region S1 and in contact with the active layer 130, and the light blocking layer 140 is disposed in the peripheral region S2 and has a second surface A2 away from the gate insulation layer 120, where a height of the second surface A2 relative to the third surface A3 is greater than a height of the first surface A1 relative to the third surface A3. According to the present application, the light blocking layer 140 is configured to be disposed in the peripheral region S2 of the gate insulation layer 120 and the second thickness H2 of the light blocking layer 140 is greater than the first thickness of the action layer 130, so the light blocking layer 140 can shield the light incident into the peripheral region, thereby preventing the light from being further incident into the active region 130 due to diffuse reflection in the peripheral region S2. Therefore, the problem of light leakage caused by the generation of optical carriers in the active layer 130 is avoided.

Figure 6:
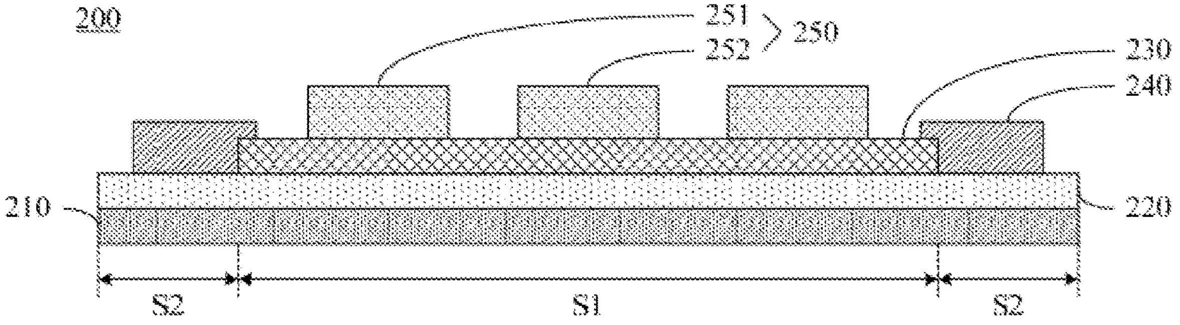
FIG. 6 is a schematic front view of the structure of an array substrate according to a second embodiment of the present application.

Referring to FIG. 6, a schematic front view of the structure of an array substrate 200 according to a second embodiment of the present application is shown. Various components of the array substrate 200 according to the second embodiment of the present application and position relationships among them can be clearly seen from the FIG. 6.

As shown in FIGS. 1 and 6, the structure of the second embodiment is substantially the same as that of the first embodiment described above, in which functions and positions of all of the gate layer 210, the gate insulation layer 220, the active layer 230, and the source/drain layer 250 (including a source 251 and a drain 252) in the second embodiment are the same as those of the gate layer 110, the gate insulation layer 120, the active layer 130, and the source/drain layer 150 (including the source 151 and the drain 152) in the first embodiment.

The second embodiment is different from the first embodiment in that the light-blocking layer 240 is manufactured by an opaque insulation material and in contact with the active layer 230 in the second embodiment, so as to further improve the light-blocking effect of the light-blocking layer 240 for the active layer 230.

Specifically, since the gate insulation layer 220 is also manufactured by an opaque insulation material, the light blocking layer 240 may be manufactured by the same material as that of the gate insulation layer 220 in the present embodiment.

Further, referring to FIG. 6, in the present embodiment, the light blocking layer 240 is not only disposed in the peripheral region S2, but also extends from the peripheral region S2 to the active layer 230 to overlap a portion of the active layer 230 so as to improve the light shielding effect of the light blocking layer 240.

Figure 7:
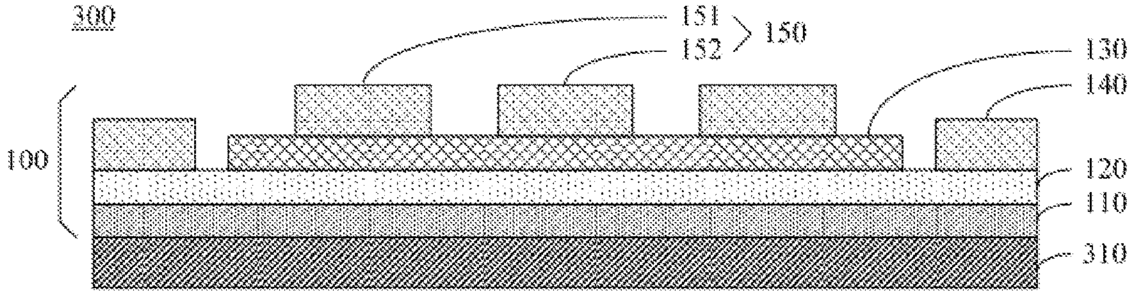
FIG. 7 is a structural view of a display device according to an embodiment of the present application.

Referring to FIG. 7, it shows a structural view of a display device 300 according to an embodiment of the present application. Various components of the display device 300 according to the embodiment of the present application and position relationships among them can be clearly seen from the FIG. 7.

As shown in FIG. 7, in the present embodiment, the display device 300 includes the array substrate 100 as described above in the first embodiment. Specifically, the display device 300 further includes a backlight module 310 located below the gate layer 110.

Further, in other embodiments of the present application, the display device 300 may also include the array substrate 200 as described above in the second embodiment, and the present application is not limited thereto.

Figure 8:
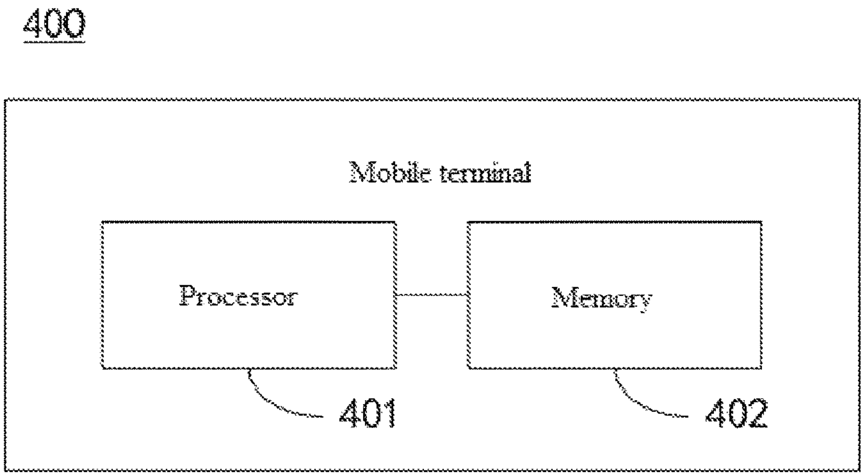
FIG. 8 is a structural view of a mobile terminal according to an embodiment of the present application.

Referring to FIG. 8, it shows a structural view of a mobile terminal 400 according to an embodiment of the present application. The display device 500 is applied to the mobile terminal 400. The mobile terminal 400 may be a smartphone, a tablet computer, or the like. Various components of the mobile terminal 400 according to embodiments of the present application and position relationships among them can be clearly seen from the FIG. 8.

As shown in FIG. 8, the mobile terminal 400 includes a processor 401 and a memory 402. The processor 401 is electrically connected to the memory 402.

The processor 401 is a control center of the mobile terminal 400, connected to various components of the mobile terminal by various interfaces and lines, and performs various functions of the mobile terminal and processes data of the mobile terminal by running or loading an application program stored in the memory 402 and invoking the data stored in the memory 402, thereby monitor the mobile terminal as a whole.

Figure 9:
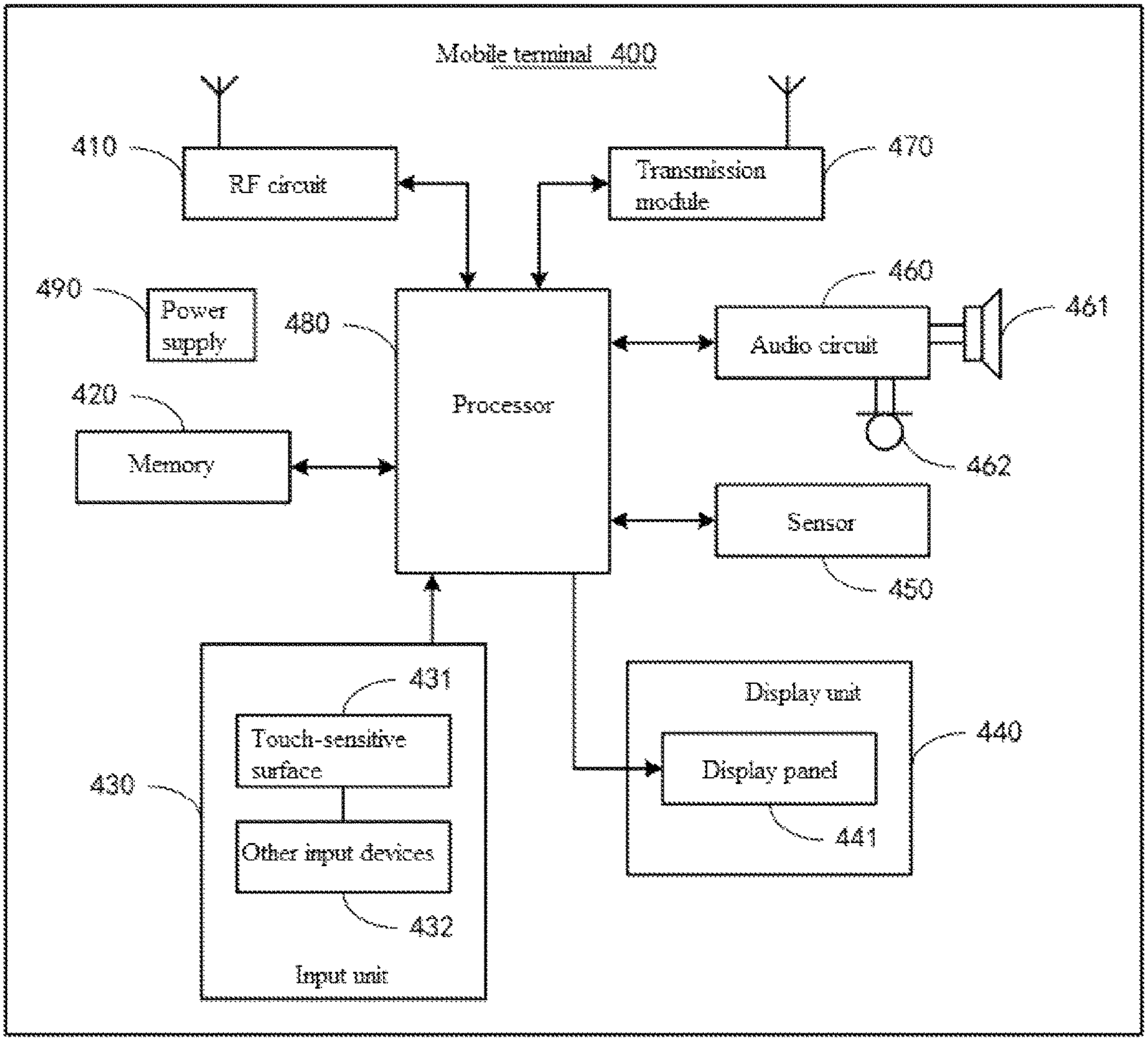
FIG. 9 is a detail structural view of a mobile terminal according to an embodiment of the present application.

Referring to FIG. 9, it shows a detail structural view of a mobile terminal 400 according to an embodiment of the present application. The mobile terminal 400 may be a smartphone, a tablet computer, or the like. Various components of the mobile terminal 400 according to embodiments of the present application and position relationships among them can be clearly seen from the FIG. 9.

FIG. 9 shows a specifically structural block diagram of a mobile terminal 400 according to an embodiment of the present application. As shown in FIG. 9, the mobile terminal 400 may include various components such as a radio frequency (RF) circuit 410, a memory 420 including one or more computer-readable storage media, an input unit 430, a display unit 440, a sensor 450, an audio circuit 460, a transmission module 470 (e.g., Wireless Fidelity, Wi-Fi), a processor 480 including one or more processing cores, and a power supply 490. It may be understood by those skilled in the art that the structure of the mobile terminal shown in FIG. 9 does not constitute a limitation on the mobile terminal, and the present disclosure may include more or less components in the mobile terminals than illustrated, or may combine certain components, or different arrangements of the components.

The RF circuit 410 is configured to receive and transmit electromagnetic waves, to realize mutual conversion between electromagnetic waves and electrical signals, and to communicate with a communication network or other equipment. The RF circuit 410 may include various existing circuit elements for performing these functions, such as an antenna, a radio frequency transceiver, a digital signal processor, an encryption/decryption chip, a subscriber identity module (SIM) card, a memory, and the like. The RF circuit 410 can communicate with various networks such as the Internet, an intranet, and a wireless network, or communicate with other devices through the wireless network. The wireless network may include a cellular telephone network, a wireless local area network, or a metropolitan area network. The above wireless network can use various communication standards, protocols and technologies, including but not limited to the Global System for Mobile Communication (GSM), Enhanced Data GSM Environment (EDGE), Wideband Code Division Multiple Access (WCDMA), Code Division Multiple Access (CDMA), Time Division Multiple Access (TDMA), Wireless Fidelity (Wi-Fi) (such as the Institute of Electrical and Electronics Engineers' standards IEEE 802.11a, IEEE 802.11b, IEEE802.11g and/or IEEE 802.11n), Voice over Internet Protocol (VoIP), Worldwide Interoperability for Microwave Access (Wi-Max), other protocols for mail, instant messaging, and short messaging, and any other suitable communication protocols, even those protocols that have not yet been developed.

The memory 420 may be used to store software programs and modules, such as the program instructions corresponding to the audio power amplifier control method described above. The processor 480 executes various functional applications and data processing by running software programs and modules stored in the memory 420, that is, to obtain the frequency of the information transmission signal transmitted by the mobile terminal 400. The memory 420 may include a high-speed random access memory, and may further include a non-volatile memory, such as one or more magnetic storage devices, a flash memory, or other non-volatile solid-state memory. In some examples, the memory 420 may further include a memory which is remotely set with respect to the processor 480, and these remote memories may be connected to the mobile terminal 400 through a network. Examples of the above network include, but are not limited to, the Internet, an intranet, a local area network, a mobile communication network, and combinations thereof.

The input unit 430 may be used to receive inputted numeric or character information, and generate input signals of a keyboard, a mouse, a joystick, an optical or a trackball, which are related to user settings and function control. Specifically, the input unit 430 may include a touch-sensitive surface 431 and other input devices 432. The touch-sensitive surface 431, also known as a touch display or touchpad, can collect user touch operations on or near it (for example, the user uses a finger, a stylus, or any suitable object or accessory near the touch-sensitive surface 431), and drive the corresponding connection device according to a preset program. Optionally, the touch-sensitive surface 431 may include two parts, which are a touch detection device and a touch controller. The touch detection device detects the user's touch position, and detects the signal brought by the touch operation, and transmits the signal to the touch controller; and the touch controller receives touch information from the touch detection device, converts the touch information into contact coordinates, and then sends the contact coordinates to the processor 480 and is capable of receiving commands from the processor 480 and executing them. In addition, various types such as resistive, capacitive, infrared, and surface acoustic waves can be used to implement the touch-sensitive surface 431. In addition to the touch-sensitive surface 431, the input unit 430 may include other input devices 432. Specifically, the other input devices 432 may include, but are not limited to, one or more of physical keyboards, function keys (such as volume control keys, switch keys), a trackball, a mouse, a joystick, and the like.

The display unit 440 may be used to display information inputted by a user or information provided to the user and various graphical user interfaces of the display terminal 400. These graphical user interfaces may be composed of graphics, text, icons, videos, and any combination thereof. The display unit 440 may include a display panel 441. Optionally, the display panel 441 may be configured in a form of a liquid crystal display (LCD) or an organic light emitting diode (OLED). Further, the touch-sensitive surface 431 may overlap the display panel 441. When the touch-sensitive surface 431 detects that a touch operation on or near the touch-sensitive surface 431, it transmits the touch operation to the processor 480, to determine a type of a touch event. The processor 480 then provides a corresponding visual output on the display panel 441 according to the type of the touch event. Although in FIG. 9, the touch-sensitive surface 431 and the display panel 441 are implemented as two separate components to realize input and output functions, while in some embodiments, the touch-sensitive surface 431 and the display panel 441 may be integrated to implement input and output functions.

The mobile terminal 400 may further include at least one sensor 450, such as a light sensor, a motion sensor, and other sensors. Specifically, the light sensor may include an ambient light sensor and a proximity sensor. The ambient light sensor may adjust the brightness of the display panel 441 according to the brightness of the ambient light. The proximity sensor may generate interruption when the flip cover is closed or turned off. As a kind of motion sensors, a gravity acceleration sensor can detect a magnitude of acceleration in various directions (generally three axes). It can detect the magnitude and direction of gravity when it is stationary. It can be used to identify the attitude of mobile phones (such as horizontal and vertical screen switching, games, and magnetometer attitude calibration), and vibration recognition related functions (such as pedometer, tapping). For the mobile terminal 400, other sensors such as a gyroscope, a barometer, a hygrometer, a thermometer, an infrared sensor, and the like may further be configured, and details are not described herein again.

The audio circuit 460, the speaker 461, and the microphone 462 may provide an audio interface between the user and the mobile terminal 400. The audio circuit 460 may transmit electrical signals converted from the received audio data to the speaker 461, and the speaker 461 converts the electrical signals into sound signals for outputting. On the other hand, the microphone 462 converts collected sound signals into electrical signals, which are received and converted into audio data by the audio circuit 460, and then the audio data are output to the processor 480 for processing, and then sends it to, for example, another terminal via the RF circuit 410. Alternatively, the audio data are outputted to the memory 420 for further processing. The audio circuit 460 may further include an earphone jack to provide communication between a peripheral headset and the mobile terminal 400.

The mobile terminal 400 can help users receive requests and send information, etc., which provide the user with wireless broadband Internet access, through a transmission module 470 (such as a Wi-Fi module). Although FIG. 9 shows the transmission module 470, it can be understood that the transmission module 470 does not belong to a necessary structure of the mobile terminal 400, and can be omitted as needed without changing the essence of the application.

The processor 480 is a control center of the mobile terminal 400, connected to various components of the mobile phone by various interfaces and lines, and performs various functions of the mobile terminal and processes data of the mobile terminal 400 by running or executing software programs and/or modules stored in the memory 420 and invoking the data stored in the memory 420, thereby performing overall monitoring on the mobile terminal. Optionally, the processor 480 may include one or more processing cores. In some embodiments, the processor 480 may be integrated with an application processor and a modem processor, wherein the application processor mainly processes an operating system, a user interface, and application programs, and the modem processor mainly processes wireless communications. It can be understood that the foregoing modem processor may not be integrated into the processor 480 either.

The mobile terminal 400 further includes a power source 490 (such as a battery) for supplying power to various components. In some embodiments, the power source may be logically connected to the processor 480 via a power management system, so as to manage functions, such as charging, discharging, and power consumption via the power management system. The power source 490 may further include other components, such as one or more direct current or alternative current power sources, a recharging system, a power failure detection circuit, a power converter or inverter, and a power status indicator.

The mobile terminal 400 may further include a camera (such as a front camera, a rear camera), a Bluetooth module, and the like although they are not shown, and details are not described herein. Specifically, in this embodiment, the display unit of the mobile terminal 400 is a touch screen display.

There may be other embodiments of the present application than the above-described embodiments. Any technical solution formed by equivalent substitution or equivalent substitution falls within the protection scope required by the present application.

In summary, although preferred embodiments have been described above in the present application, the above-mentioned preferred embodiments are not intended to limit the present application. Those of ordinary skilled in the art can make various modifications and changes without departing from the spirit and scope of the present application. Therefore, the protection scope of the present application is subject to the scope defined by the claims.

What is claimed is:

1. An array substrate, comprising at least:

a gate insulation layer and an active layer disposed sequentially on a gate layer, wherein the gate insulation layer has a central region overlapped with the active layer and a peripheral region surrounding the central region, the active layer has a first surface away from the gate insulation layer, and the gate insulation layer has a third surface located in the central region and in contact with the active layer;

a light blocking layer disposed in the peripheral region and having a second surface away from the gate insulation layer, wherein a height of the second surface relative to the third surface is greater than a height of the first surface relative to the third surface; and a source/drain layer disposed on the active layer;

wherein the gate insulation layer has a fourth surface located in the peripheral region and in contact with the light blocking layer, the third surface and the fourth surface extend in a same plane, the active layer has a first thickness, and the light blocking layer has a second thickness greater than the first thickness;

wherein the light blocking layer substantially surrounds the active layer and is disposed at four sides of the active layer; and wherein the light blocking layer has two notches respectively disposed at two ones of the four sides of the active layer, and at least two parts of the source/drain layer isolated from each other are accommodated in the two notches, respectively.

2. The array substrate of claim 1, wherein a material of the light blocking layer is the same as a material of the source/drain layer, and the light blocking layer and the source/drain layer are separated by a dielectric material.

3. The array substrate of claim 2, wherein a potential of the light blocking layer is configured to be floating.

4. The array substrate of claim 1, wherein a material of the light blocking layer is the same as a material of the gate insulation layer.

5. The array substrate of claim 4, wherein the light blocking layer is in contact with the active layer.

6. A method of manufacturing an array substrate, comprising at least:

sequentially forming a gate insulation layer and an active layer on a gate layer, wherein the gate insulation layer has a central region overlapped with the active layer and a peripheral region surrounding the central region, the active layer has a first surface away from the gate insulation layer, and the gate insulation layer has a third surface located in the central region and in contact with the active layer;

forming a light blocking layer in the peripheral region, wherein the light blocking layer has a second surface away from the gate insulation layer, a height of the second surface relative to the third surface is greater than a height of the first surface relative to the third surface, the gate insulation layer has a fourth surface located in the peripheral region and in contact with the light blocking layer, the third surface and the fourth surface extend in the same plane, and the active layer has a first thickness; and forming a source/drain layer on the active layer;

wherein the forming of the light blocking layer in the peripheral region comprises: forming the light blocking layer located in the peripheral region and a source/drain layer located on the active layer with the same mask, wherein the light blocking layer has a second thickness greater than the first thickness;

wherein the light blocking layer substantially surrounds the active layer and is disposed at four sides of the active layer; and wherein the light blocking layer has two notches respectively disposed at two ones of the four sides of the active layer, and at least two parts of the source/drain layer isolated from each other are accommodated in the two notches, respectively.

7. A display device, comprising an array substrate comprising at least:

a gate insulation layer and an active layer disposed sequentially on a gate layer, wherein the gate insulation layer has a central region overlapped with the active layer and a peripheral region surrounding the central region, the active layer has a first surface away from the gate insulation layer, and the gate insulation layer has a third surface located in the central region and in contact with the active layer;

a light blocking layer disposed in the peripheral region and having a second surface away from the gate insulation layer, wherein a height of the second surface relative to the third surface is greater than a height of the first surface relative to the third surface; and a source/drain layer disposed on the active layer;

wherein the gate insulation layer has a fourth surface located in the peripheral region and in contact with the light blocking layer, the third surface and the fourth surface extend in a same plane, the active layer has a first thickness, and the light blocking layer has a second thickness greater than the first thickness;

wherein the light blocking layer substantially surrounds the active layer and is disposed at four sides of the active layer; and wherein the light blocking layer has two notches respectively disposed at two ones of the four sides of the active layer, and at least two parts of the source/drain layer isolated from each other are accommodated in the two notches, respectively.

8. The display device of claim 7, wherein a material of the light blocking layer is the same as a material of the source/drain layer, and the light blocking layer and the source/drain layer are separated by a dielectric material.

9. The display device of claim 8, wherein a potential of the light blocking layer is configured to be floating.

10. The display device of claim 7, wherein the material of the light blocking layer is the same as a material of the gate insulation layer.

11. The display device of claim 10, wherein the light blocking layer is in contact with the active layer.

* * * * *